United States Patent [19]

Yurek

[11] 4,301,331
[45] Nov. 17, 1981

[54] COMPOSITE LIMITING SUM AND DIFFERENCE CIRCUITRY FOR EXTENDING THE RECEPTION AREA OF A FREQUENCY MODULATED STEREO RADIO TRANSMITTER

[76] Inventor: John J. Yurek, R.D. #6, Box 413, Irwin, Pa. 15642

[21] Appl. No.: 94,508

[22] Filed: Nov. 15, 1979

Related U.S. Application Data

[63] Continuation of Ser. No. 770,807, Feb. 22, 1977, abandoned.

[51] Int. Cl.³ .............................................. H04H 5/00
[52] U.S. Cl. .............................. 179/1 GC; 179/1 GD; 455/117
[58] Field of Search ............. 179/1 GB, 1 GC, 1 GD, 179/1 GE, 1 GH, 1 GS; 455/116, 117, 126

[56] References Cited

U.S. PATENT DOCUMENTS

| | | | |
|---|---|---|---|
| 2,903,518 | 9/1959 | Kahn | 179/1 GS |
| 3,233,044 | 2/1966 | Hopper | 179/1 GE |
| 3,422,356 | 1/1969 | Fritts | 455/116 |
| 3,529,244 | 9/1970 | Torick et al. | 455/110 |
| 3,706,852 | 12/1972 | Angus | 455/117 |
| 3,754,099 | 8/1973 | Takaoka | 179/1 GH |
| 3,991,370 | 11/1976 | Pate | 455/108 |

Primary Examiner—Douglas W. Olms
Attorney, Agent, or Firm—Jon M. Lewis

[57] ABSTRACT

A frequency modulated stereo transmitter in the preferred embodiment has a stereo generator which receives audio sterero signals directly. The stereo generator includes gain control circuitry which acts directly on the sum and difference signals generated in the stereo generator.

The stereo generator then directly modulates a modulation protion of an RF transmitter unit thereby maintaining a very high index of modulation. Audio gain control and audio limiting are thus eliminated. In alternative embodiments the stereo generator unit gain control circuitry is adapted to existing FM stereo transmitters.

8 Claims, 14 Drawing Figures

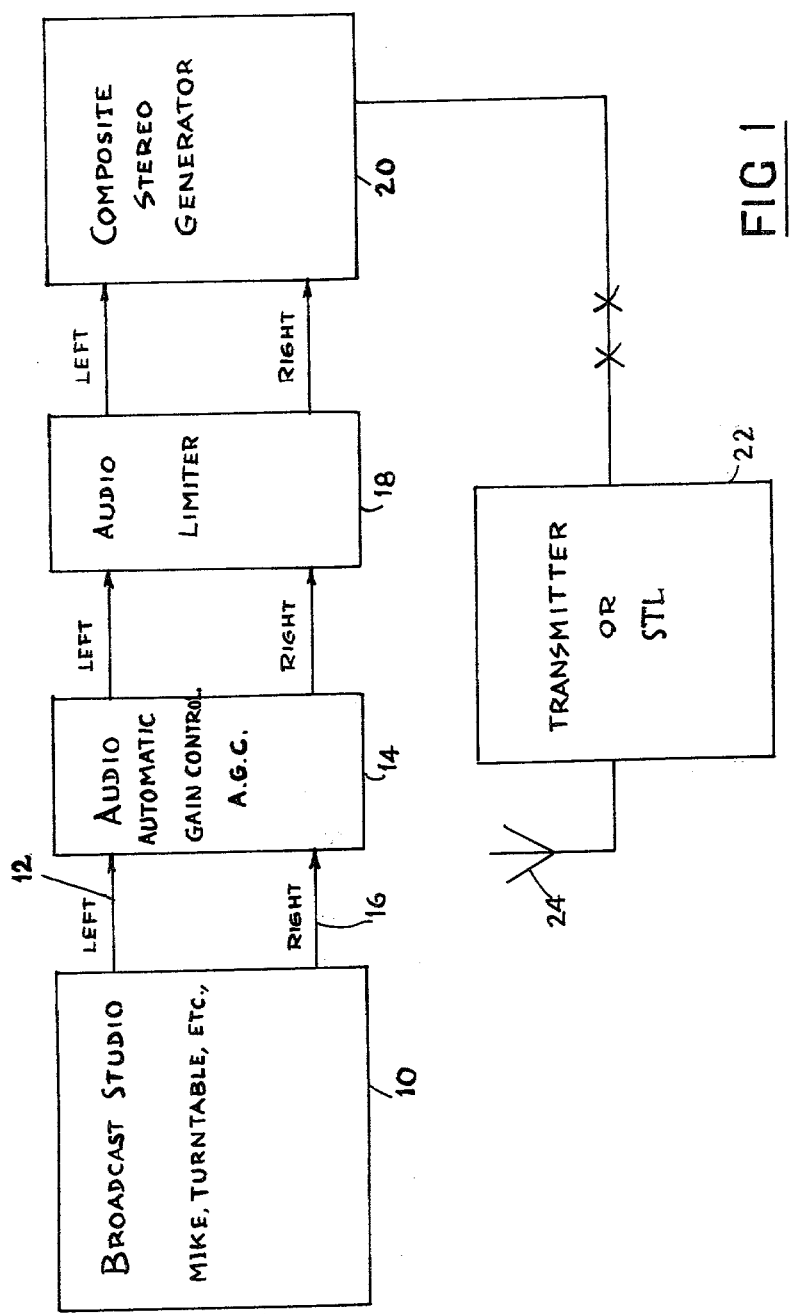

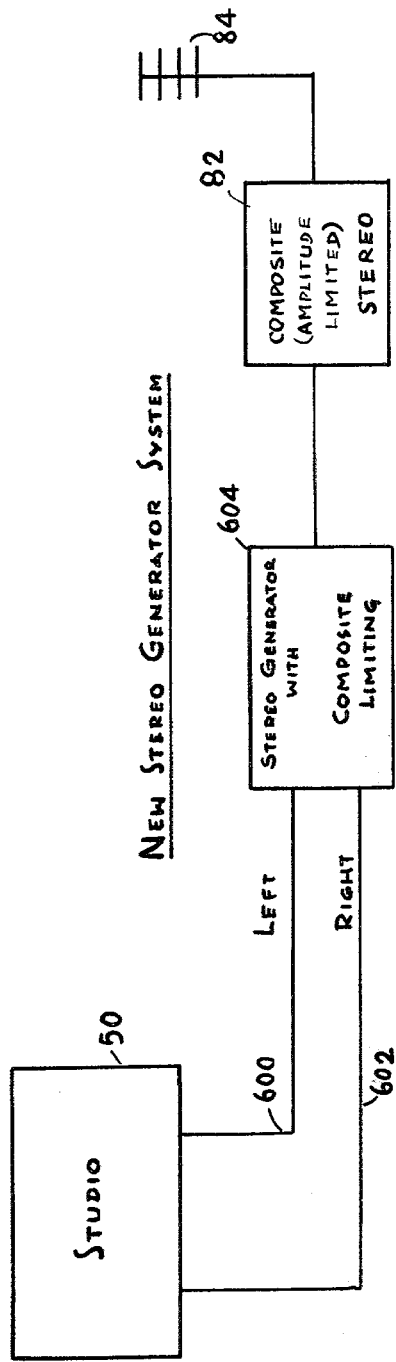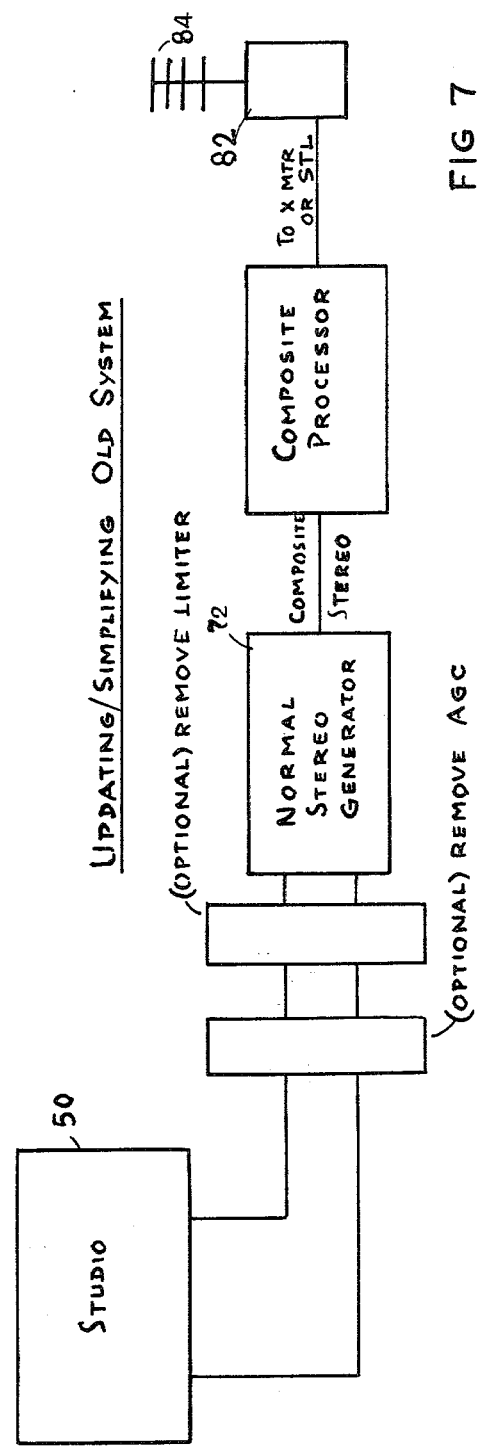

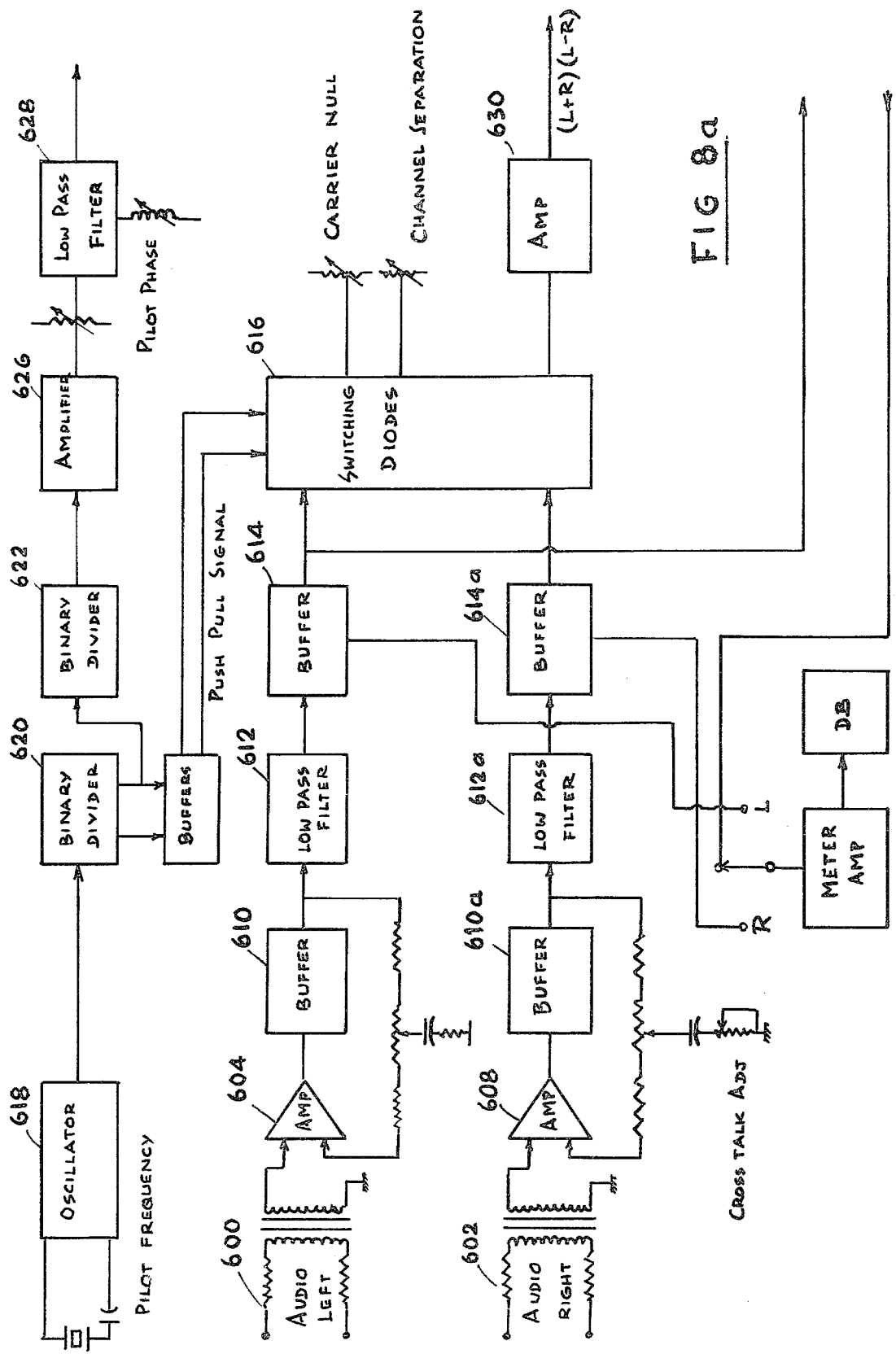

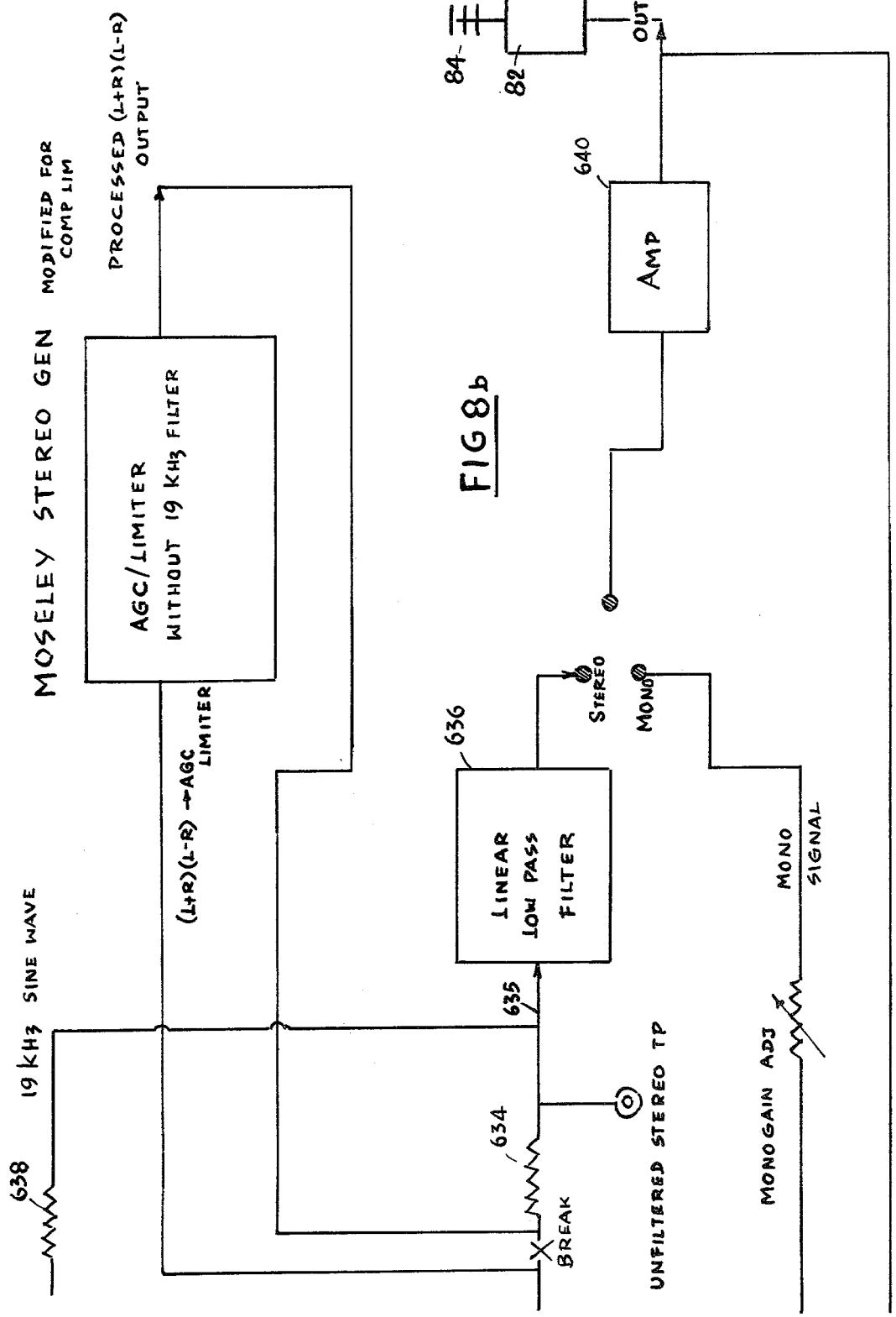

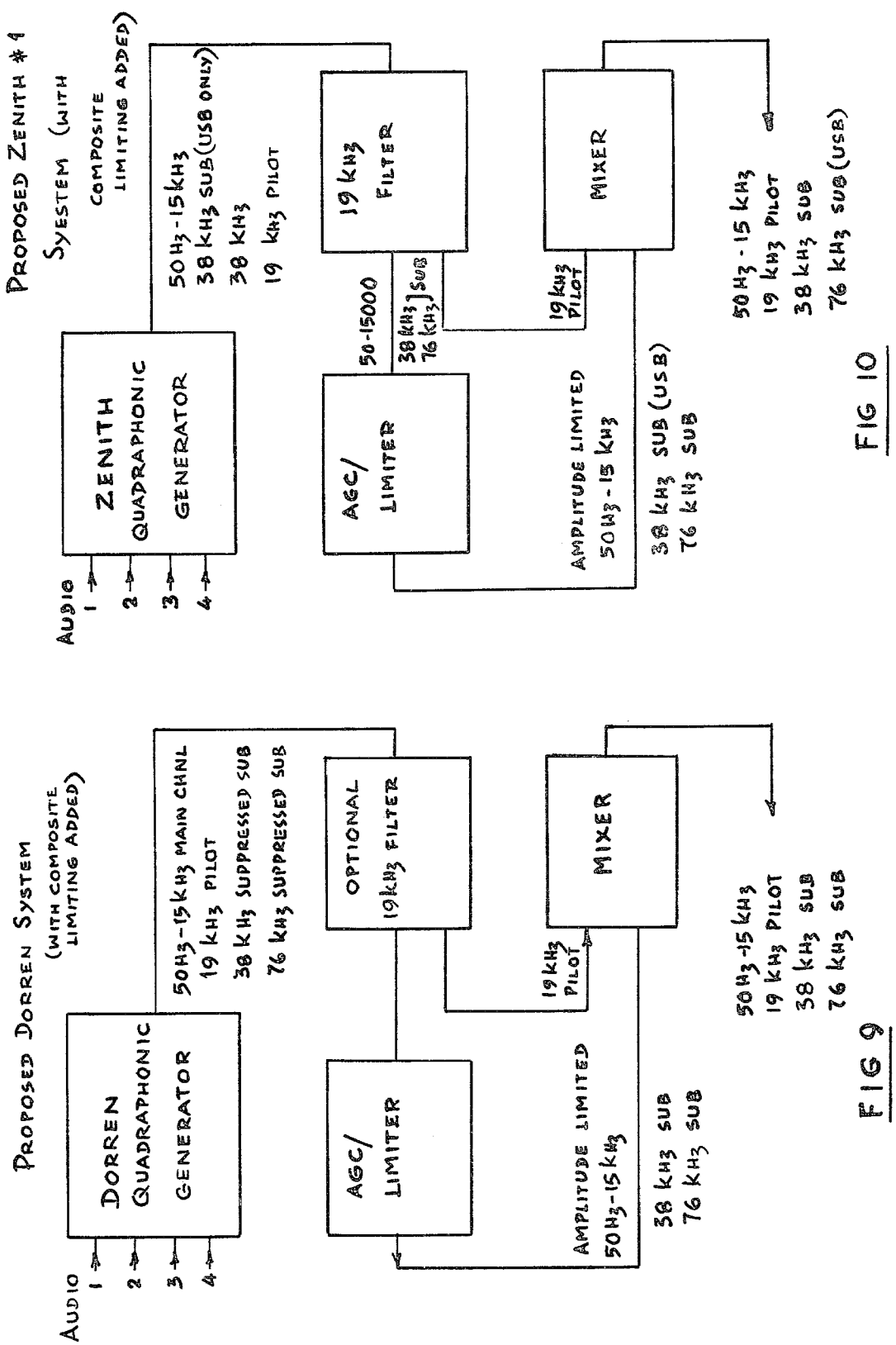

COMPOSITE LIMITING SUM AND DIFFERENCE CIRCUITRY FOR EXTENDING THE RECEPTION AREA OF A FREQUENCY MODULATED STEREO RADIO TRANSMITTER

This application is a continuation of Ser. No. 770,807, Feb. 22, 1977, abandoned.

BACKGROUND OF THE INVENTION

1. Field of the Invention

This present invention relates to frequency modulated transmitters and more particularly to frequency modulated stereo transmitters. 2. Description of Prior Art Typically frequency modulated stereo transmitters have two audio stereo channels, a left and a right channel generated from a disc record or tape recording as two separate signals, one being a right signal and the other being a left signal.

Over the past several years many four-channel stereo FM transmission systems have been proposed for general broadcasting over the FM frequencies allocated by the U.S. Federal Communications Commission. The four stereo channels typically comprise a left forward channel, a right forward channel, a left back channel and a right back channel. Various four-channel FM transmission systems as well as different four-channel phonograph record systems are described in an article entitled "4-Channel FM 9 Ways to Go" by Len Feldman, in the Radio-Electronics Magazine of October 1973, starting on page 40.

As shown in FIG. 1, a block diagram of a prior art stereo FM transmission system, a two-channel stereo system, and its operation, will be described as an example. The operation of a four-channel system is analogous.

A left signal and a right signal are generated by audio equipment in a broadcast studio 10. The audio equipment will typically be a phonograph turntable playing a stereo record, a stereo tape player generating signals from stereo magnetic tape, or at least two microphones picking up music or conversation live in the studio 10. The left signal is typically inputted onto a left signal channel 12 to an audio automatic gain control (AGC) unit 14. The right signal is similarly inputted into the AGC unit 14 over a right signal channel 16. The gain controlled signals are fed into an audio limiter unit 18 where the gain controlled right signal and the gain controlled left signal are audio limited, in order to prevent overmodulation of the transmitted signal, independently of one another. The processed left and right signals are fed from the audio limiter unit 18 to a composite stereo generator 20 which generates two signals, one of which is a sum of the left and the right processed signals and the other of which is the difference of the left and right processed signals which are fed into the composite stereo generator 20 from the audio limiter 18. As is well known in the prior art, the composite stereo generator 20 typically generates the sum of the right and left signals from about 50 Hz to 15 KHz, injects a pilot carrier at 19 KHz, and generates a difference signal from about 23 KHz to 53 KHz. The output of the composite stereo generator 20 is then amplified by a transmitter unit 22 for transmission by an antenna 24.

In the prior art transmitter system, as shown in FIG. 1, the automatic gain control unit 14 limits the left and right channel signals individually. Since both the left and right signal channels must be balanced at all times in order to reproduce the input signals with fidelity, the AGC unit 14 must reduce and increase the signals passed thereby in both channels equally. Therefore, if the signal in one channel exceeds a predetermined value both signals are reduced by the same ratio which very seriously limits the modulation of the transmitter 22 and causes the well known phenomenon of stereo FM stations dropping out at a receiver before monaural FM stations having substantially the same transmitter location and transmitting power and characteristics. This dropping out phenomenon is most noticeable in mobile receivers in automobiles. Typically, prior art transmitting systems must maintain an average modulation of 70-80% in order not to be overmodulated should both the right and the left channel simultaneously generate maximum signals. Therefore, in order to foreclose the possibility of overmodulation at any time, the prior art stereo FM transmitters substantially underutilize their transmitting capacity and cover a much smaller reception area than identical monaural transmitters. This shortcoming of FM stereo transmitters has been recognized since the initiation of FM stereo broadcasting and extensive efforts have been made since then to overcome this problem.

Another problem lies in AGC units, such as 14, which typically require about fifteen frequency and amplitude filter characteristic adjustments for each channel over the audio band of frequencies which is expensive and time consuming. These filter components generate both phase distortion and lag components in the signals transmitted therethrough which impair the operation of the transmitter system by producing ringing, phase and amplitude distortion.

The audio limiter 18 also contributes to the undermodulation and amplitude distortion analogous to those contributed by the AGC unit 14. The operation of the audio limiter 18 is restricted to large amplitude and very rapidly varying signals which AGC unit 14 is not able to control. In addition, the inherent problems of balance between the left and right channel signals contribute to even more distortion since when the signal in one channel is limited, the other channel signal will almost invariably not be limited equally, thereby leading to imbalance between the channels.

In the prior art, limiting of the stereo signals is accomplished solely before a signal is generated by the composite stereo generator 20 for transmission to an antenna by the transmitter unit 22. The relationship between the sum and difference of the right and left stereo signal channels does not bear a one-to-one relationship with the individual right and left channel signals. Therefore, the gain controlled right and left signals, from the AGC unit 14 do not bear a completely predictable relationship which can be used to generate a composite stereo signal which can be adjusted in amplitude to maintain a maximally modulated transmitted signal from the antenna 24.

By limiting the left and right audio signals, the signal which modulates the transmitter unit only exercises very imprecise control of the modulation thereof which results in that the output signal from the antenna 24 varies erratically and cannot be maintained at a maximum amplitude for maximum signal coverage. In reception areas having a strong signal the automatic gain control in a typical receiver compensates for this transmitter system's shortcoming by maintaining the received volume substantially constant. However, in fringe reception areas a typical receiver is unable to control the volume which fluctuates erratically which is very annoying to a listener and makes the reception undesirable.

SUMMARY OF THE INVENTION

The present invention provides for control of the composite stereo signal containing the sum and differences of the right and left stereo channels in a frequency modulated stereo transmitter for connection to stereo audio equipment generating at least two audio channel signals in at least two channels, the transmitter comprising means for generating signals representative of relationships of at least one sum of at least two audio signals and at least one difference of at least two of said audio signals; means for controlling the amplitude of the representative relationship signals having an input operatively connected to the representative signal generating means and generating amplitude controlled representative relationship signals; and an FM transmitter unit operatively connected to the amplitude controlling means and receiving said amplitude controlled representative relationship signals and to transmit at least one FM signal containing information including said amplitude controlled relationship signals over an FM channel having predetermined frequency characteristics, predetermined bandwidth and predetermined maximum modulation.

A preferred embodiment of the present invention provides virtually continuous substantially maximum transmitter modulation thereby increasing the reception coverage area for a transmitter with an RF transmitter unit being designed for a predetermined maximum power output and/or allocated to transmit at a coefficient of modulation not to exceed 100%; for example, in the U.S., the F.C.C. Regulations. The preferred embodiment of the present invention maintains the modulation of the RF transmitter unit substantially at a maximum, thereby extending the range of the stereo transmitter. In addition, in the preferred embodiment the audio automatic gain control 14 and the audio limiter 18 with all their associated problems, imbalances, distortions, expense of operation and maintenance are eliminated. Since the gain control and preferably even the limiting are performed on the sum and difference signals, both audio signals therein are modified in substantially exactly the same manner, thereby maintaining both audio signals in substantially the same constant balance during all audio amplitudes and frequencies of operation.

In an alternative embodiment of the invention a conversion arrangement is described which permits the conversion of an existing FM stereo transmitter. Because of the substantial investment required to build a new transmitter, a conversion arrangement would provide broadcasters with a considerable saving when converting to high modulation coefficient balanced FM transmission stereo.

BRIEF DESCRIPTION OF THE DRAWINGS

FIG. 1 is a block diagram of a typical prior art FM stereo transmitting system;

FIG. 6 is a block diagram of a preferred embodiment of the invention;

FIG. 7 is a block diagram of an alternative embodiment of the invention;

FIG. 8, including 8A & 8B, is a combined schematic and block diagram of a stereo generator, automatic gain controller and limiter according to the invention;

FIG. 9 is a block diagram of a four-channel stereo FM transmitting system according to the invention;

FIG. 10 is another block diagram of a four-channel stereo FM transmitting system according to the invention;

DESCRIPTION OF THE PREFERRED EMBODIMENTS

Figure 2A:
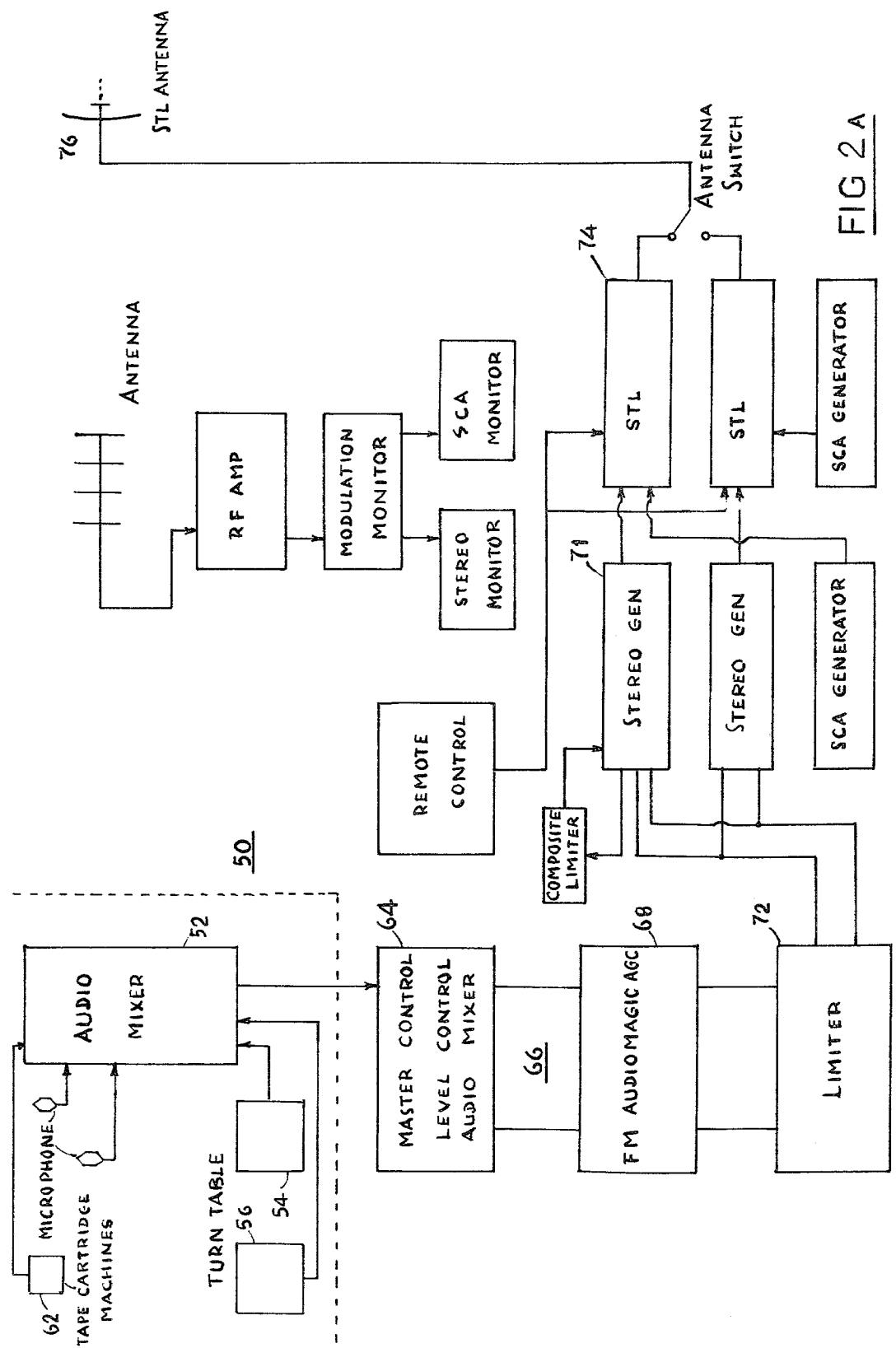
FIG. 2A is a block diagram of an alternative embodiment of the FM stereo transmitting system according to the invention.
Figure 2B:
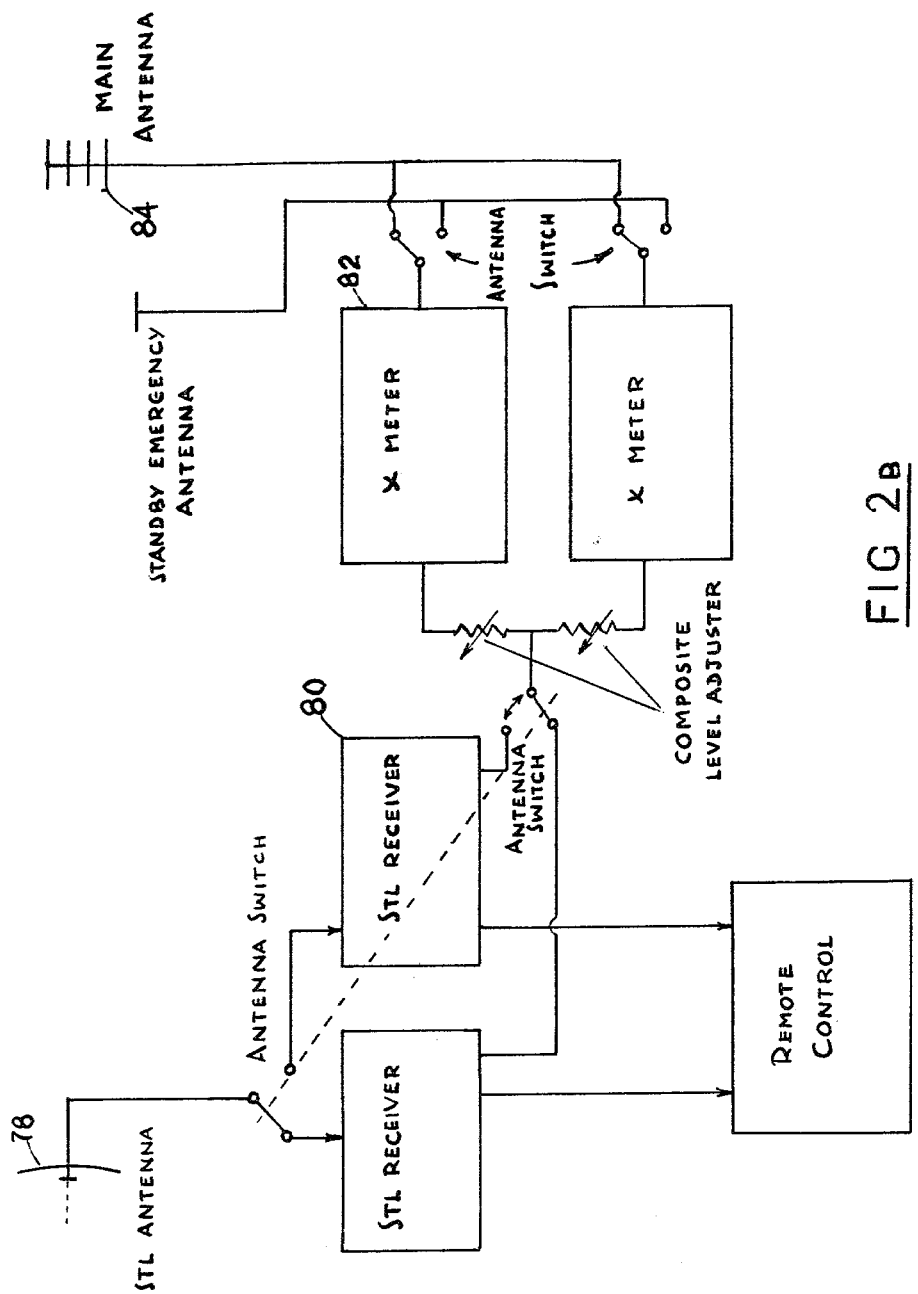
FIG. 2B is a block diagram of an alternative embodiment of the FM stereo transmitting system according to the invention.

Referring to FIGS. 2A and 2B, a transmitter system which has been modified to incorporate an embodiment of the invention is shown.

Referring to FIG. 2A, a studio 50 is shown having an audio mixer 52 with several inputs for various stereo audio equipment such as phonograph turntables 54 and 56, microphones 58 and 60, and tape cartridge machines 62. The stereo signals from the audio mixer 52 are fed into a control room 66 having an audio mixer 64 where the stereo signals are mixed as known in the prior art. The mixed stereo signals from the mixer 64 are fed into an AGC unit 68 where their maximum amplitudes are limited. In order to prevent any large amplitude signals from exceeding the instantaneous power limitations of the transmitter system either from the design of the output states of the transmitter unit 22 or governmental or intergovernmental requirements such as the U.S. Federal Communications Commission Regulations which could subject a transmitter system user to sanctions, such as fines or even the suspension of a license to operate, a hard amplitude limiter 70 limits the signals transmitted therethrough. The signals from the hard limiter 70 are fed to a composite stereo generator and composite limiter 72 which generates sum and difference signals as described in FIG. 1 but without the 19 KHz pilot carrier. The pilot carrier may either be filtered out by a filter or not generated by the stereo generator portion of 72. Circuit details of the stereo generator portion and composite generator 72 will be described later. The limited composite stereo signals from the generator 72 are typically modulated by a modulator 74 for transmission by a link comprising 900–1000 KHz antennas, such as an antenna 76 and an antenna 78, as shown in FIG. 2B. The signal received by the antenna 78 is demodulated by a receiver 80 and fed into a high power FM transmitter 82 for transmission to FM receivers, not shown, by an FM antenna 84.

Figure 3:
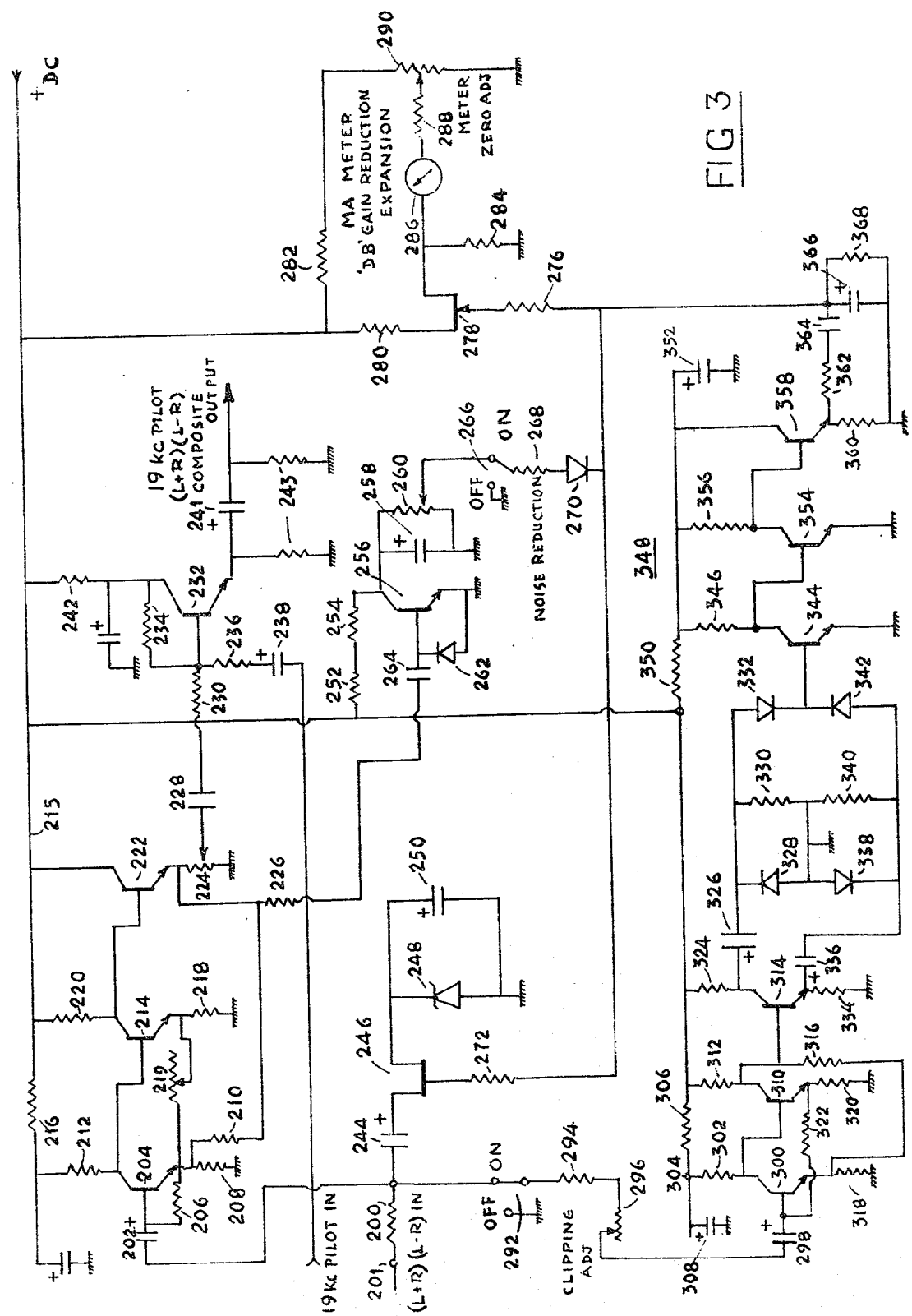
FIG. 3 is a schematic circuit diagram of a gain control circuit, a limiter circuit, a noise reduction circuit according to the invention.

FIG. 3 shows a typical stereo generator circuit 100 which comprises a portion of the composite stereo generator and composite limiter 72.

Figure 4:
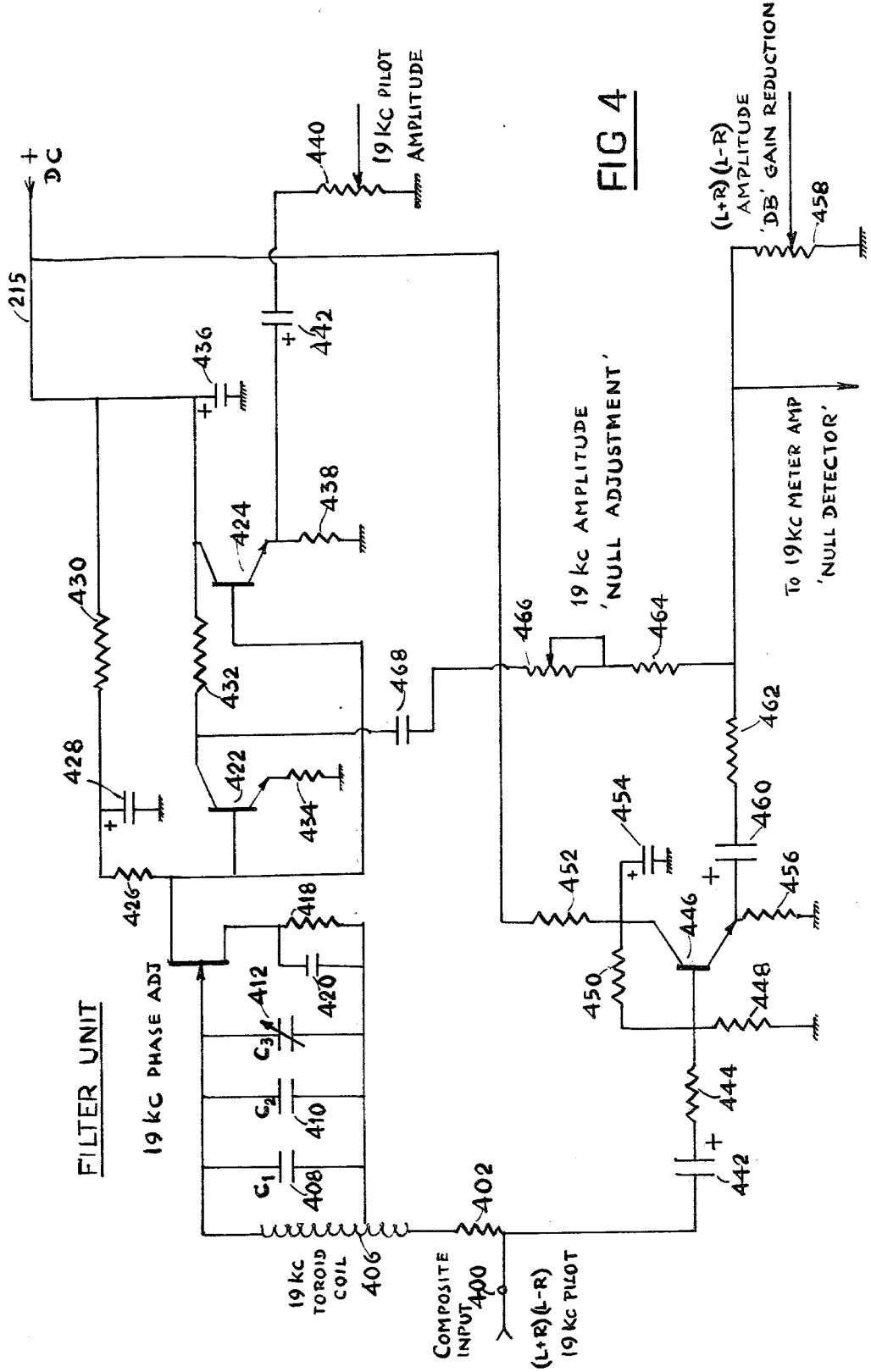
FIG. 4 is a schematic circuit diagram of a 19 KHz filter unit according to an alternative embodiment of the invention.

FIG. 4 shows a schematic diagram of a portion of the invention shown in FIGS. 2A and 2B and incorporated in the composite stereo generator and composite limiter 72. The sum and difference signals are fed into a terminal 201 connected to one end of a resistor 200. The other end of the resistor 200, not connected to the terminal 201, is connected to one end of a capacitor 202. The other end of the capacitor 202, not connected to the resistor 200, is connected to the base of a transistor 204 and to one end of a resistor 206. The emitter of the transistor 204 is connected to one end of a resistor 208 and one end of a resistor 210. The collector of the transistor 204 is connected to one end of a resistor 212 and to the base of a transistor 214. The other end of the resistor 208, not connected to the emitter of the transistor 204, is connected to a point of ground potential. The other end of the resistor 212 is connected to a source of power 215 through a filter 216 comprising a resistor and a capacitor. The emitter of the transistor 214 is connected to one end of a resistor 218 and one end of a pot 219. The other end of the pot 219, not connected to the transistor 214, is connected to the other end of the resistor 206. The other end of the resistor 218, not connected to the transistor 214, is connected to ground potential. The collector of the transistor 214 is connected to one end of a resistor 220 and to the base of a transistor 222. The other end of the resistor 220, not connected to the collector of the transistor 214, is connected to the source of power 215. The collector of the transistor 222 is connected to the source of power 215. The emitter of the transistor 222 is connected to the other end of the resistor 210 not connected to the emitter of the transistor 204, to one fixed end of a pot 224 and to one end of a resistor 226, not connected to the capacitor 264. The other fixed end of the pot 224, not connected to the emitter of the transistor 222, is connected to ground. The sliding contact of the pot 224 is connected to a capacitor 228, the other end of which is connected to a resistor 230. The other end of the resistor 230 is connected to the base of a transistor 232 and to the one end of each of resistors 234 and 236. The other end of the resistor 236, not connected to the resistor 230, is connected to a capacitor 238 which receives the 19 KHz pilot carrier signal. The collector of the transistor 232 is connected to the other end of the resistor 234 which is not connected to the resistor 230 and to the power source 215 through a filter 240. The emitter of the transistor 232 is connected to an AC pass filter 242 which outputs the sum of the 19 KC pilot signals and the composite gain controlled and limited sum and difference of the stereo signals.

The end of the resistor 200, which is connected to the capacitor 202, is also connected to another capacitor 244 which in turn is connected to a field effect transistor 246. The field effect transistor 246 acts as a variable resistor in this circuit for providing automatic gain control by attenuating incoming signals from the terminal 201 on the left side of the resistor 200. The capacitor 244 is connected to a current-carrying terminal, either to the drain or the source, of the field effect transistor (FET) 246. The other current-carrying terminal of the field effect transistor 246, whichever is not connected to the capacitor 244, either the source or drain thereon, is connected to the cathode of a Zener diode 248. The anode of the diode 248 is connected to a point of ground potential. A capacitor 250 is connected across the Zener diode 248. The cathode of the Zener diode 248 is connected to one end of each a resistor 252 and a resistor 254. The end of the resistor 252 which is not connected to the Zener diode 248 is connected to the source of DC 215. The end of the resistor 254 which is not connected to the Zener diode 248 is connected to a junction between the collector of a transistor 256 and one end of a capacitor 258 and to one of the fixed ends of a potentiometer 260. The other end of the capacitor 260 and the fixed end of the potentiometer 262 which are not connected to the resistor 254 are connected to a point of ground potential. Across the emitter and base of the transistor 256 a diode 262 is connected, having its cathode connected to the base and its anode connected to emitter. Also connected to the base of the transistor 256 is one end of a capacitor 264. The end of the capacitor 264 which is not connected to the base of the transistor 256 is connected to the endo of the resistor 226 which is not connected to the transistor 222.

The wiper of the potentiometer 260 is connected to an on-off noise reduction switch 266 such that the wiper of the potentiometer 260 may be connected to and disconnected from one end of a resistor 268. The end of the resistor 268 which is not connected to the switch 266 is connected to the anode of a diode 270. The cathode of the diode 270 is connected to one end of a resistor 272 which has its other end connected to the gate of the field effect transistor 246.

The diode 270 has its cathode connected to one end of a resistor 276. The end of the resistor 276 which is not connected to the diode 270 is connected to the gate of a field effect transistor 278. Either the source or drain of the field effect transistor 278 is connected to one end of a resistor 280 which has its other end connected to the source of DC potential 215 and also to one end of a resistor 282. The current-carrying terminal of the field effect transistor 278 not connected to the resistor 280 is connected to a resistor 284 and to a db gain reduction and expansion meter 286 which has its other end connected through a resistor 288 to the wiper of a potentiometer 290. One end of the potentiometer 290 is connected to the end of the resistor 282 which is not connected to the DC potential and the other end of the potentiometer 290 is connected to a source of ground potential. The potentiometer 290 is a meter zero adjust potentiometer.

Also connected to the juncture of the resistor 200 and the capacitors 202 and 244 is an automatic gain control switch 292 which can connect or disconnect a resistor 294 and the automatic gain control circuit connected thereto from the juncture of said three components. The end of the resistor 294 which is not connected to the switch 292 is connected to a variable resistor 296 having its slider connected to one end thereof. The variable resistor 296 is used to vary the characteristic of the automatic gain control. The end of the resistor 296 which is not connected to the resistor 294 is connected through a capacitor 298 to the base of a transistor 300. The collector of the transistor 300 is connected to a collector resistor 302 which is connected to an RC power supply filter 304 comprising a resistor 306 and a capacitor 308 connected in the usual manner which filter 304 is connected to the source of DC 215. The collector of the transistor 300 is connected to the base of a transistor 310. A collector resistor 312 of the transistor 310 is connected to the source of DC 215. The collector of the transistor 310 is also connected to the base of a transistor 314 and to a resistor 316. The end of the resistor 316, which is not connected to the base of the transistor 314, is connected to a ground potential by a resistor 318. The resistor 318 at the juncture of the resistors 316 and 318 connects the emitter of the transistor 300 to ground potential. The emitter of the transistor 310 is connected to ground potential by a resistor 320. The emitter of the transistor 310 is connected to the base of the transistor 300 by a resistor 322. The collector of the transistor 314 is connected to the DC source 215 by a resistor 324. The collector of the transistor 314 is connected by a capacitor 326 to the juncture of the cathode of a diode 328, one end of a resistor 330, and the anode of a diode 332. The emitter of the transistor 314 is connected to ground potential by a resistor 334. A capacitor 336 connects the emitter of the transistor 314 to the juncture of the cathode of a diode 338, one end of a resistor 340 and the anode of a diode 342. The anode of the diode 328, the anode of the diode 338, the ends of the resistors 330 and 340 which are not connected, respectively, to the cathodes of the diodes 328 and 338, are all connected to a point of ground potential. The cathodes of the diodes 332 and 342 are connected to the base of a transistor 344. The emitter of the transistor 344 is connected to a point of ground potential. The collector of the transistor 344 is connected to one end of a resistor 346. The other end of the resistor 346 is connected to a low-pass power supply filter 348 comprising the resistor 350 and the capacitor 352. The end of the resistor 350 which is not connected to the resistor 346 is connected to a source of DC voltage 215, and the capacitor 352 is connected to a point of ground potential. The collector of the transistor 344 is connected to the base of a transistor 354. The emitter of the transistor 354 is connected to a source of ground potential. The collector of the transistor 354 is connected to the resistor 356. The end of the resistor 356 not connected to the transistor 354 is connected to the juncture of the resistor and the capacitor 352. The collector of the transistor 354 is connected to the base of a transistor 358. The collector of the transistor 358 is connected to the juncture of the resistors 356, 346, and 350 and the capacitor 352. The emitter of the transistor 358 is connected to ground potential by a resistor 360. The emitter of the transistor 358 is connected through a resistor 362 to the anode of a diode 364. The cathode of the diode 364 is connected to the cathode of the diode 270 and a resistor 368 and the resistor 276 and a capacitor 366. The ends of the capacitor 366 and the resistor 368 not connected to the diode 364 are connected to ground potential. The values and interrelationships of the resistors 360, 362 and 368, the capacitor 366 and the diode are chosen in a known manner to achieve automatic gain control.

Referring now to FIG. 4, a filter emit for filtering 19 KHz is shown. A signal comprising the sum and difference of the stereo audio signals and the 19 KC pilot carrier, such as, from the output of the composite stereo generator 20 of FIG. 1, is connected to a terminal 400. The terminal 400 is connected through a resistor 402 to one extreme electrical end of a toroidal coil 406. The opposite extreme electrical end of the toroidal coil 406 is connected to the juncture of the capacitors 408, 410, 412 and the gate of a field effect transistor 416. One current-carrying terminal of the field effect transistor 416, being either the source or the drain thereof, is connected to ground potential through the parallel combination of a resistor 418 and a capacitor 420. The ends of the capacitors 408, 410 and 412, not connected to the gate of the transistor 416, and the opposite end of the toroidal coil 406, are connected to a point of ground potential and to an intermediate tap of the toroidal coil 406. The current-carrying terminal of the field effect transistor 416, not connected to the parallel combination of the capacitor 420 and the resistor 418, is connected to the bases of transistors 422 and 424 and to one end of a resistor 426. The end of the resistor 426 not connected to the field effect transistor 416 is connected to one end of a resistor 430 to ground by a capacitor 428. The end of the resistor 430, not connected to the capacitor 428, is connected to the source of DC 215. The collector of the transistor 422 is connected through a resistor 432 to the source of DC voltage 215. The emitter of the transistor 422 is connected to a source of ground potential by a resistor 434. The collector of the transistor 424 is connected to the source of DC voltage 215 and is also connected to a point of ground potential through a capacitor 436. The emitter of the transistor 424 is connected to a point of ground potential through a resistor 438, and also connected to an end terminal of a potentiometer 440 through a capacitor 442. The other end of the potentiometer 440, not connected to the capacitor 442, is connected to a point of ground potential. The wiper of the potentiometer 440 generates a 19 KHz signal for use as the pilot carrier signal.

The terminal 400 is connected to a capacitor 442, a resistor 444, series combination to the base of a transistor 446. The base of the transistor 446 is connected to a point of ground potential by a resistor 448 and to its own collector by a resistor 450. The collector of the transistor 446 is connected to the source of DC voltage 215 by a resistor 452 and also connected to a source of ground potential by a capacitor 454. The emitter of the transistor 446 is connected to a source of ground potential through a resistor 456 and also connected to one end of a potentiometer 466 by two resistors 462, 464, and a capacitor 460 series combination. The potentiometer 466 is a 19 KHz amplitude null adjuster. The juncture of the resistor 462 and the resistor 464 is connected to one end of the potentiometer 458. The end of the potentiometer 458 not connected to the resistor 462, is connected to a point of ground potential. The wiper of the potentiometer 458 generates a signal which comprises the sum and difference of the stereo signals but without the 19 KHz pilot carrier signal therein, and is a sum and difference amplitude adjuster. The wiper of the potentiometer 458 in the alternative embodiment, is connected to the terminal 201 of FIG. 3.

Figure 5:
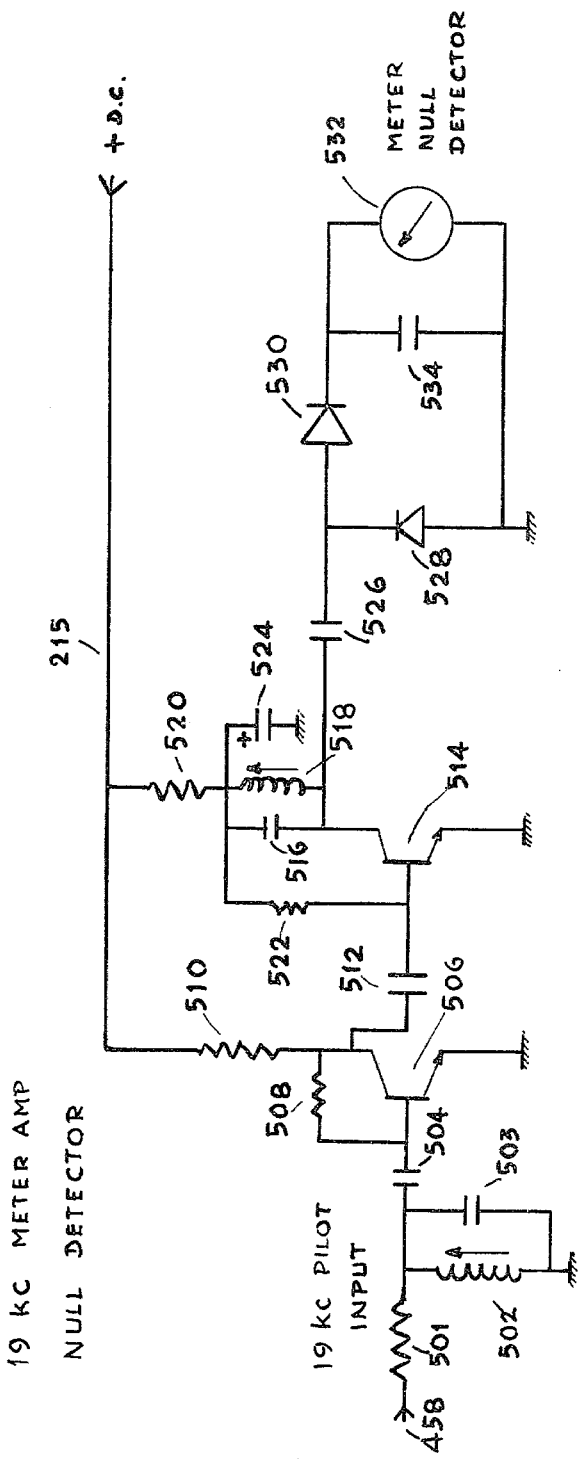
FIG. 5 is a schematic circuit diagram of a 19 KHz meter amplifier used in an alternative embodiment of the invention.
Figure 12:
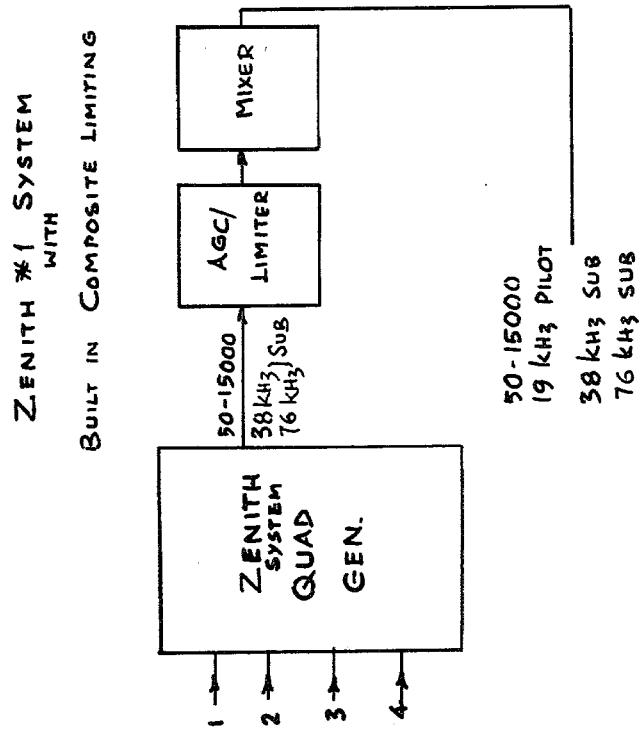
FIG. 12 is yet a further block diagram of a four-channel stereo FM transmitting system according to the invention.
Figure 11:
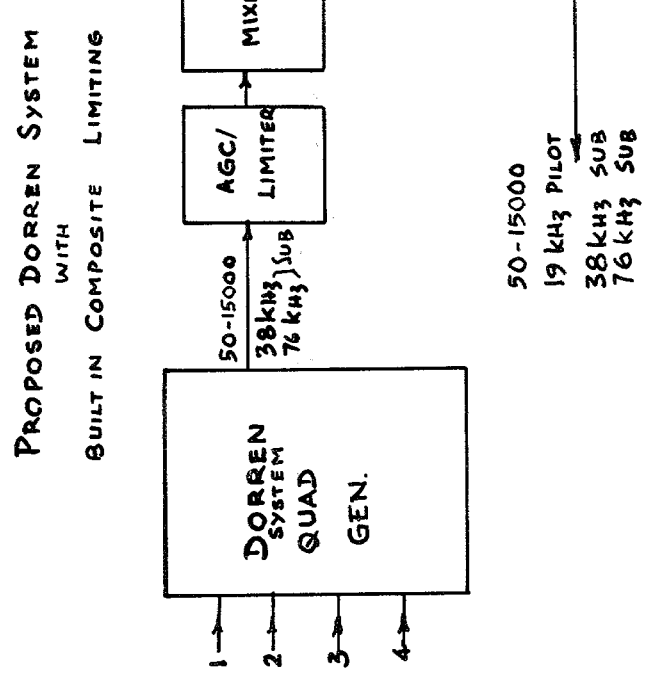
FIG. 11 is yet another block diagram of a four-channel stereo FM transmitting system according to the invention.

Referring now to FIG. 5, the potentiometer 458, as shown in FIG. 4, has its wiper connected to an input terminal 501, which terminal comprises the input to a 19 KHz null detector circuit. The terminal 501 is connected to one side of a resistor 500. The end of the resistor 500 not connected to the potentiometer is connected to the juncture of a slug tune coil 502, a capacitor 503 and another capacitor 504. The other ends of the coil 502 and the capacitor 503 which are not connected to the juncture including the resistor 500 are connected to a point of ground potential. The resistor 504 connects the resistor 500 to the base of a transistor 506. The base and the collector of the transistor 506 are interconnected by a resistor 508. The emitter of the transistor 506 is connected to a point of ground potential. The collector of the transistor 506 is connected to the source of DC voltage 215 by a resistor 510, and also connected through a capacitor 512 to the base of a transistor 514. The emitters of the transistors 506 and 514 are connected to a point of ground potential. The collector of the transistor 514 is connected by a capacitor 516 and a coil 518 having a slug tuning capability which comprises a parallel combination to a resistor 520. The juncture of the resistor 520, the capacitor 516 and the coil 518 is connected to the base of the transistor 514 by a resistor 522 and to a point of ground potential by a capacitor 524. The end of the resistor 520 not connected to the juncture of the capacitor 516 and the coil 518 is connected to the source of DC potential 215. The collector of the transistor 514 is connected through a capacitor 526 to the cathode of a diode 528 and the anode of a diode 530. The cathode of the diode 530 is connected to ground by a parallel combination of a meter-null detector meter 532 and a capacitor 534. The anode of the diode 528 is connected to a source of ground potential.

The operation of the filter unit in FIG. 4 will now be described. The composite input signal including the sum and difference signals and the 19 KC pilot carrier signal is fed into the coil 406. The coil 406 passes only the 19 KHz signal which is amplified by the transistor Q1 and phase inverted by the transistor 422. The composite input signal containing the sum and difference signals and the 19 KHz pilot carrier is also fed into the transistor 446. The output of the transistor 446 is added to the output of the transistor 422 at the juncture of the resistors 462 and 464 where the 19 KHz signal is nulled out, leaving only the sum and difference signals at the output which is adjusted by the potentiometer 458. A signal from the transistor 416 is fed to the transistor 424 which is operated as an emitter follower. Therefore a 19 KHz pilot signal is generated which is in phase with the original 9 KHz pilot signal as opposed to the output signal from the transistor 422 which is 180° out of phase with the 19 KHz pilot signal. The 19 KHz pilot signal from the transistor 422 as described previously is used to null out the 19 KHz pilot signal from the composite signal at the terminal 400.

The operation of the circuitry shown in FIG. 3 will now be described. The sum and difference signals from the potentiometer 458 as shown in FIG. 4 are fed into the input terminal 201, the resistor 200 as shown in FIG. 3. The signal consisting of the sum and difference signals is amplified by the amplifier which comprises the transistors 300, 310 and 314 and then rectified by the diodes 328, 338, 332 and 342. The rectified signal is then amplified by the transistors 344, 354 and 358. The circuitry comprising the resistor 362, the diode 364, the capacitor 366 and the resistor 368 acts as an automatic gain control circuit which varies the resistance of the FET 246 and which attenuates the input signal, thereby varying the signal input to the transistor 204. The signal from the diode 364, capacitor 366 and the resistor 368 are fed to the gate of the field transistor 246 and acts to vary the resistance of the field effect transistor 246, thereby varying the amplitude of the signal at the juncture of the resistor 200 and the capacitor 202. This variation of the signal changes the input signal at the base of the transistor 204. The combination of transistors 204, 214 and 222 acts as a positive and negative clipping circuit which performs the hard clipping action described earlier. An automatic gain control adjustment is made by varying the value of the variable resistor 296 which is a potentiometer having its slider connected to one end thereof.

The automatic gain control signal from the diode 364 is fed into a field effect transistor 278 which controls the movement of the meter 286 such that the gain reduction and expansion of the signal can be monitored.

The signal from the output of the transistor 222 is fed into an amplifying circuit connected to the transistor 256. The signal from the transistor 256 is filtered by the capacitor 258 and fed to the gate of the field effect transistor 246 through the resistor 268 and the diode connected in series therewith 270. The function of the circuitry connected to transistor 256 is to reduce the gain of the circuit by reducing the gain of the unit between the terminal 201 and the output at the resistor 243 when no signal is present at the input. By reducing the gain when no signal is present, a very large gain and therefore the annoying phenomenon of the first syllable or word of an announcement after a period of relative silence in the transmission being exceedingly loud and harsh to the listener will be eliminated. The circuitry as shown in FIG. 3 provides not only gain control, clipping, but also noise reduction.

The FIG. 5 circuitry shows a 19 KHz meter amplifier, the operation of which is understandable by the perusal of the diagram by one skilled in the art.

In FIG. 6 a new transmitter embodying the preferred embodiment of the invention is shown. The studio 50 generates typically a left and a right signal in channels 600 and 602. It will be recognized that a greater number of stereo channels may be used rather than just two channels. A stereo generator with automatic gain control 604 as described in FIG. 3 is shown connected to the two channels 600 and 602 from the studio 50. The amplitude controlled sum and difference stereo signal from the generator 604 is fed into the transmitter 82 which is similar to the transmitter 82 as shown in FIG. 2B. The transmitter 82 is connected to the antenna 84.

In FIG. 7 the studio 50 is shown connected to a normal stereo generator 72 such as manufactured by Moseley Associates, Inc. of Goleta, California, which is connected to a sum and difference AGC circuit 73 as shown in FIGS. 3, 4 and 5. The AGC unit 73 is connected to the transmitter 82 which in turn is connected to the antenna 84.

FIG. 8 shows the stereo generator having a sum and difference automatic gain control unit 604 in detail. The two stereo audio channels 600 and 602 from the studio 50 as shown in FIG. 6 feed into respective amplifiers 604 and 608. The output of the amplifier 604 is fed into a buffer amplifier 610. The output of the buffer amplifier 610 is fed back to an input of the amplifier 604. The output of the amplifier 610 is fed into a 17 KHz low-pass filter 612. The output of the filter 612 is fed into another buffer amplifier 614. The output of the amplifier 608 is fed into a buffer amplifier 610A connected to a filter 612A which is connected to a buffer amplifier 614A. The components 610A, 612A and 614A operate in an analogous fashion to the components 610, 612 and 614. The outputs of the amplifiers 614 and 614A are connected to a switching diode matrix 616 which generates the sum and difference signals as previously described. An oscillator 618 generates typically a 76 KHz signal which is divided down by binary counters 620 and 622. The binary divider 620 is connected to a buffer amplifier 624 which in turn is connected to and controls the switching of the switching diode matrix unit 616. The binary divider 622 is connected to an amplifier 626 which in turn is connected to the input of a low-pass filter 628 at the output of which the 19 KHz signal for use as the pilot carrier signal is present. The output of the switching diode matrix unit 616 is connected to an amplifier 630 which is connected to a sum and difference AGC unit 632 without a 19 KHz filter unit, such as the unit in FIG. 3, without the resistor 236 or the capacitor 238; otherwise the unit 632 in the preferred embodiment may be identical to the unit of FIG. 3. The main difference in the AGC unit 632 and the unit shown in FIG. 3 is that the capacitor 238 and the resistor 236 which comprise the 19 KHz pilot signal input are removed. The output of the amplifier 630 is connected to the input terminal 201 on the left side of the resistor 200, forming the input for the unit. The filter output 242 at the juncture of the capacitor 241 and the resistor 243 is connected to a resistor 634. The end of the resistor 634, which is not connected to the resistor 243, is connected to the input of a low-pass filter 636, and the end of a resistor 638 which is connected to the output of the low-pass filter 628 is connected to the juncture 635 of the resistors 634 and the low-pass filter 636. At the juncture 635 the 19 KHz signal and the sum and difference AGC signals, as previously described, are added. The output of the low-pass filter 636 is connected to the input of an amplifier 640, the output of which is connected to the input of the transmitter unit 82, which output is connected to the antenna 84. Provisions have also been made for a connection to a monaural mode of operation.

The details of circuitry in FIG. 8 not shown in detail in FIGS. 3, 4 and 5 are well known in the art and may be analogous and similar to stereo generators manufactured by many manufacturers of stereo generators, an example of one being Moseley Associates, Inc.

A list of equipment typically found in an FM stereo broadcasting station, some of which may be used in the practicing of the embodiments of the invention are as follows.

---

All audio consoles and turntables
    McCurdy Radio Industries Limited
    108 Carnforth Road
    Toronto, Ontario M4A 2L4
    CANADA
Audimax (AGC)
Volumax (Limiter)
    CBS Laboratories
    Stamford, Connecticut
RF Amp
Modulation Monitor
Stereo Monitor
SCA Monitor
    Belar Electronics Laboratory, Inc.
    P. O. Box 83
    Delaware and Montroes Avenues
    Upper Darby, Pennsylvania 19084
Stereo Generator SCG-3T
SCA Generator
PCL-303/C STL
Remote Control PBR-30
    Moseley Associates, Inc.
    Santa Barbara Research Park
    Goleta, California 93017
ITC Cartridge
Tape Machines
    International Tapetronics Corporation
STL Antennas
    SCALA Radio Corporation
    1970 Republic Avenue
    San Leandro, California 94577
RCA XMTR
    RCA Broadcast Systems
    Camden, New Jersey 08102

---

FIGS. 9-12 show various four-channel stereo FM systems according to the invention.

Whether or not the audio AGC and audio limiter are used with sum and difference AGC will depend upon what the station management wants its signal to sound like.

If it is a rock-music oriented station the owner will probably use every gimmick available to process audio. This will include the normal audio AGC unit followed with an audio limiter followed with sum and difference AGC which will produce a very loud signal that will seemingly jump out of the radio. It is usually also very tiresome to listen to for any length of time, but is very impressive when first tuned in.

If, on the other hand, the station is a "good music" type station, the station management will probably want to use only composite limiting and completely remove the normal audio AGC and limiter systems. All of the undesired sounds that are associated with these units will also be eliminated with their removal. Composite limiting will allow the station to maintain a high average modulation level without sacrificing quality. Maintenance and adjustment will also be easier.

As can readily be seen by persons skilled in the art, the foregoing description is not limited to the embodiments disclosed therein, but is intended to encompass all other embodiments of the invention which a person skilled in the art could visualize or reduce to practice.

What is claimed is:

1. A frequency-modulated stereo transmitter for connection to stereo audio equipment generating at least two audio channel signals in at least two channels, the transmitter comprising:

means for generating signals representative of relationships of at least one sum of at least two audio signals and at least one difference of at least two of said audio signals;

means for controlling the amplitude of the representative relationship signals having an input operatively connected to the representative signal generating means and generating amplitude controlled representative relationship signals; and an FM transmitter unit operatively connected to the amplitude controlling means and receiving said amplitude controlled representative relationship signals and to transmit at least one FM signal containing information including said amplitude controlled relationship signals over an FM channel having predetermined frequency characteristics, predetermined bandwidth and predetermined maximum modulation, Wherein the representative relationship generating means includes means for generating at least two representative stereo signals, And wherein the stereo generating means includes means for generating at least an audio frequency channel, a lower side band channel and an upper side band channel, And wherein the amplitude controlling means controls said representative relationship signals such that said predetermined maximum modulation is not exceeded, And including means for adding a pilot carrier frequency signal to the transmitted FM signals, And wherein the pilot carrier adding means operatively adds a signal representative of said pilot carrier frequency signal to the amplitude controlled representative relationship signals, And wherein said representative relationship generating means generates a pilot carrier signal, and said transmitter includes means for attenuating the pilot carrier signal added by said representative relationship generating means, and including means operatively connected with said representative signal generating means for decreasing the amplitude of the signal received by the transmitter unit for a period of time when at least one of the audio signals diminishes below a predetermined amplitude.

2. The transmitter as claimed in claim 1 wherein the amplitude controlling means includes means for maintaining predetermined maximum modulation characteristics.

3. The transmitter as claimed in claim 2 wherein the maximum modulation maintaining means includes means for limiting the amplitude controlled signals.

4. The transmitter as claimed in claim 1 including means for adding a pilot carrier frequency signal to the transmitted FM signals.

5. The transmitter as claimed in claim 1 including means for automatically limiting the amplitude controlled signals.

6. A frequency-modulated stereo transmitter for connection to stereo audio equipment generating at least two audio channel signals in at least two channels, the transmitter comprising:

means for generating signals representative of relationships of at least one sum of at least two audio signals and at least one difference of at least two of said audio signals;

means for controlling the amplitude of the representative relationship signals having an input operatively connected to the representative signal generating means and generating amplitude controlled representative relationship signals; and an FM transmitter unit operatively connected to the amplitude controlling means and receiving said amplitude controlled representative relationship signals and to transmit at least one FM signal containing information including said amplitude controlled relationship signals over an FM channel having predetermined frequency characteristics, predetermined bandwidth and predetermined maximum modulation, means operatively connected with said representative signal generating means for decreasing the amplitude of the signal received by the transmitter unit for a period of time when at least one of the audio signals diminishes below a predetermined amplitude.

7. The transmitter as claimed in claim 6 including means for automatically limiting the amplitude controlled signals.

8. The transmitter as claimed in claim 6 including means for adding a pilot carrier frequency signal to the transmitted FM signals.

* * * * *